United States Patent [19]

Kuo et al.

[11] Patent Number: 4,459,497
[45] Date of Patent: Jul. 10, 1984

[54] SENSE AMPLIFIER USING DIFFERENT THRESHOLD MOS DEVICES

[75] Inventors: Clinton C. K. Kuo, Austin; Horst Leuschner, Lewisville, both of Tex.

[73] Assignee: Motorola, Inc., Schaumburg, Ill.

[21] Appl. No.: 342,040

[22] Filed: Jan. 25, 1982

[51] Int. Cl.³ .......................... H03K 5/24; G11C 7/06
[52] U.S. Cl. .................................. 307/530; 307/450; 365/208
[58] Field of Search ............... 307/350, 360, 354, 363, 307/450, 530, 548, 550, 264, 475, 568; 365/206–208

[56] References Cited

U.S. PATENT DOCUMENTS

| | | | |
|---|---|---|---|
| 3,560,765 | 2/1971 | Kubinec | 307/530 X |
| 4,179,626 | 12/1979 | Oehler | 307/530 |
| 4,239,994 | 12/1980 | Stewart | 365/208 X |
| 4,365,172 | 12/1982 | Prater | 307/450 X |
| 4,386,284 | 5/1983 | Wacyk | 307/550 X |
| 4,388,541 | 6/1983 | Giebel | 307/530 |

OTHER PUBLICATIONS

Wong et al., "A 45ns Fully-Static 16K MOS ROM", 1981 IEEE-ISSCC, Digest of Technical Papers, pp. 150-151, 2/19/1981.

Giebel, "An 8K EEPROM Using the SIMOS Storage Cell", IEEE-ISSC, vol. SC-15, No. 3, pp. 311-315, 6/1980.

Primary Examiner—Larry N. Anagnos
Attorney, Agent, or Firm—James L. Clingan, Jr.

[57] ABSTRACT

A sense amplifier quickly charges a column line to a first predetermined voltage level with first, second and third transistors and then charges the column to a second predetermined voltage by using only the second and third transistors. The second and third transistors continue charging to the second predetermined voltage by virtue of having a lower threshold voltage than the first transistor. If a selected memory cell in the column is in a conducting state, the column charges to only the first predetermined voltage for detection as a logic "0". If the selected memory cell in the column is in a non-conducting state, the column continues charging to the second predetermined voltage for detection as a logic "1".

15 Claims, 3 Drawing Figures

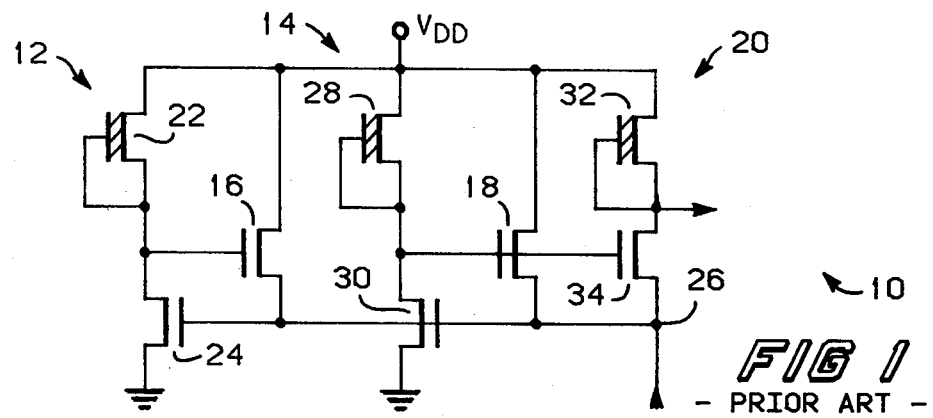
FIG 1 - PRIOR ART -
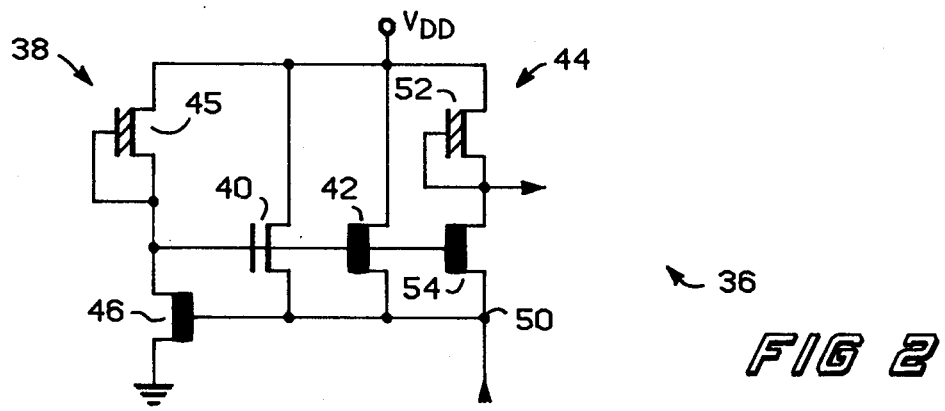
FIG 2
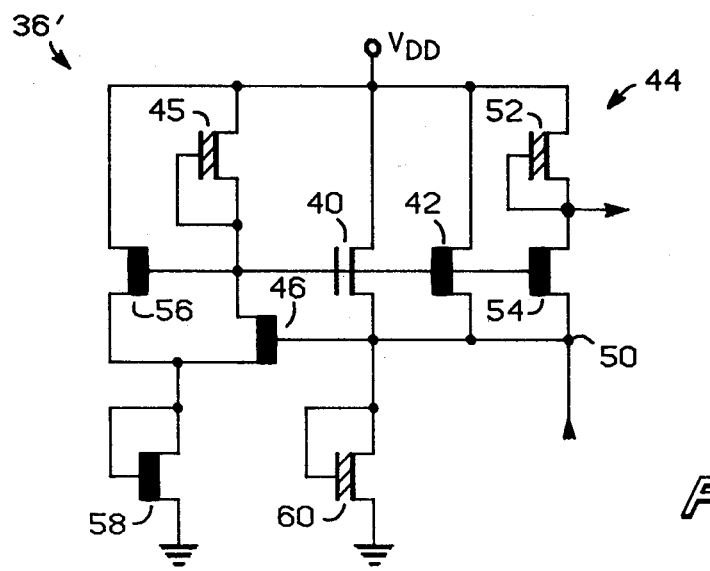
FIG 3

SENSE AMPLIFIER USING DIFFERENT THRESHOLD MOS DEVICES

CROSS-REFERENCE TO RELATED APPLICATIONS

Related subject matter is disclosed in the following related applications filed Sept. 28, 1981 and assigned to the assignee hereof:
1. U.S. patent application Ser. No. 305,830 entitled "Memory With Permanent Array Division Capability" and now U.S. Pat. No. 4,408,305.
2. U.S patent application Ser. No. 306,119 entitled "EEPROM With Bulk Zero Program Capability" and now U.S. Pat. No. 4,412,309.
3. U.S. patent application Ser. No. 306,120 entitled "Column and Row Erasable EEPROM" and now U.S. Pat. No. 4,408,306.

TECHNICAL FIELD

This invention relates, in general, to sense amplifiers, and more particularly to sense amplifiers for quickly and reliably sensing information stored in memory cells which are conducting current in a logic "0" state and not conducting current in a logic "1" state.

BACKGROUND ART

In memory circuits comprised of cells which are conducting current in a logic "0" state and are not conducting current in a logic "1" state, sense amplifiers are designed to sense current flow for a determination as to whether a logic "1" or a logic "0" is stored by an addressed memory cell. In a conventional memory circuit, the memory cells are arranged in an array established by rows and columns with one memory cell at each intersection of a row and column. A memory cell to be read is coupled to the sense amplifier by coupling the column which contains the memory cell to be read to the sense amplifier via a column decoder. Because such a column has a relatively large capacitance, current flows into the column for some duration even when the memory cell to be read is not conducting current. Consequently there is a delay time before a logic "1" can be detected.

To minimize this delay time, techniques have been developed to rapidly charge the column capacitance with a charging circuit. The charging circuit provides a relatively large amount of current until a first predetermined voltage on the column is reached. A second charge circuit continues to supply current unless a second predetermined voltage is reached at which time a current stops flowing implying the memory cell to be read is in a logic "1" state. If the memory cell to be read is in a logic "0" state, the memory cell conducts sufficient current so that the second charge circuit will not drive the column to the second predetermined voltage. In the prior art the two charge circuits comprise insulated gate field effect transistors of differing sizes. The difference in the two predetermined voltages is established by the difference in ratio of the size of certain transistors in the two charge circuits. Consequently the difference between the two predetermined voltages is dependent upon the ability of the process for manufacturing the transistors to control size ratios. Size ratios are typically easier to control than absolute sizes, but there is still some undesirable variation in size ratios. Consequently the design of the charge circuits must include a consideration of the variation in size ratio over process variations. The size ratios of the two charge circuits must be designed to be of sufficient difference to ensure that the first predetermined voltage is less than the second predetermined voltage over process variation. At the same time, however, it is desirable for the difference between the two predetermined voltages to be minimized in order to minimize the time for the column voltage to traverse from the first to the second predetermined voltage in the case where the memory cell to be read is in a logic "1" state.

SUMMARY OF THE INVENTION

An object of the invention is to provide an improved sense amplifier.

Another object of the invention is to provide a sense amplifier which utilizes threshold differentials of transistors instead of size ratio differentials for charging a column to different voltage levels.

The above and other objects and advantages of the present invention are achieved by an inverter having an input coupled to a column at a charge node and an output coupled to an enhancement transistor and a natural transistor. The natural and enhancement transistors each having a control electrode coupled to the output of the inverter, a first current electrode coupled to a power supply terminal, and a second current electrode coupled to the charge node. An output transistor has a control electrode coupled to the output of the inverter, a first current electrode coupled to a depletion transistor and forming an output node therebetween, and a second current electrode coupled to the charge node.

BRIEF DESCRIPTION OF THE DRAWINGS

FIG. 1 is a circuit diagram of a sense amplifier of the prior art.

FIG. 2 is a circuit diagram of a sense amplifier according to a preferred embodiment of the present invention.

FIG. 3 is a circuit diagram of a modified form of the sense amplifier of FIG. 2.

DESCRIPTION OF A PREFERRED EMBODIMENT

Shown in FIG. 1 is a sense amplifier 10 of the prior art comprised generally of an inverter 12, and inverter 14, a transistor 16, a transistor 18, and output circuit 20. The sense amplifiers of FIGS. 1-3 are depicted using conventional N channel insulated gate field effect transistors of one of three types, natural transistors, enhancement transistors and depletion transistors. The natural transistors described herein have a characteristic threshold voltage of 0.0 to 0.4 volts, the enhancement transistors described herein have a characteristic threshold voltage of 0.4 to 0.8 volts, and the depletion transistors described herein have a characteristic threshold voltage of −3 to −4 volts.

Inverter 12 comprises a depletion transistor 22 and an enhancement transistor 24. Transistor 22 has a drain connected to a positive power supply terminal $V_{DD}$, with a voltage of, for example, 5 volts, and a source and a gate connected together at an output of inverter 12. Transistor 24 has a gate connected to a charge node 26 at an input of inverter 12, a drain connected to the source and gate of transistor 22, and a source connected to a negative power supply terminal, shown as ground.

Inverter 14 comprises a depletion transistor 28 and an enhancement transistor 30. Transistor 28 has a drain connected to $V_{DD}$, and a gate and a source connected together at an output of inverter 14. Transistor 30 has a gate connected to charge node 26 at an input of inverter 14, a source connected to ground, and a drain connected to the gate and source of transistor 28.

Output circuit 20 comprises a depletion transistor 32 and an enhancement transistor 34. Transistor 32 has a drain connected to $V_{DD}$, and a source and gate connected together at an output of sense amplifier 10. Transistor 34 has a gate connected to the output of inverter 14, a source connected to node 26, and a drain connected to the source and gate of transistor 32.

Transistors 16 and 18 are both enhancement transistors. Transistor 16 has a gate connected to the output of inverter 12, a drain connected to $V_{DD}$, and a source connected to node 26. Transistor 18 has a gate connected to the output of inverter 14, a drain connected to $V_{DD}$, and a source connected to node 26.

Charge node 26 is an input of sense amplifier 10. The input of sense amplifier 10 is typically a column of memory cells. One of the memory cells is selected to be read for a determination as to whether a logic "1" or a logic "0" is stored therein. A logic "1" is characterized as the memory cell being in a non-conducting state, whereas a logic "0" is characterized as the memory cell being in a conducting state. In a memory device it is understood that there will be many columns with many memory cells per column and that a column is coupled to charge node 26 via a column decoder. In specifying performance characteristics of a memory, worst case conditions must be considered. Even though a column, typically having a relatively large capacitance associated with it, may be charged to some voltage prior to being coupled to sense amplifier 10, a typical worst case condition for a memory is a case where the column is completely discharged to ground when the column is coupled to sense amplifier 10. Accordingly, initial voltage of the column will hereafter be considered to be ground.

With node 26 initially at ground, transistors 24 and 30 are initially off so that the gates of transistors 16, 18 and 34 are at $V_{DD}$, turning transistors 16, 18 and 34 on. Transistor 34 has a negligible voltage drop in an on state so that the output of sense amplifier 10 is essentially the same as the voltage on node 26. Current will continue to flow through transistor 16 until the voltage difference $V_{GS16}$ between the voltage on the gate of transistor 16 and the voltage on node 26 is less than the threshold voltage of transistor 16. With transistors 16, 18 and 34 supplying current to the column coupled to node 26, node 26 quickly rises in voltage. When node 26 reaches the threshold voltage of transistor 24, transistor 24 turns on, drawing current through transistor 22 and thereby causing the voltage on the gate of transistor 16 to be reduced. As the voltage on node 26 continues to increase, transistor 24 will conduct more current, causing the voltage on the gate of transistor 16 to be further reduced. Consequently, as the voltage on node 26 increases, voltage difference $V_{GS16}$ will drop below the threshold voltage of transistor 16, turning transistor 16 off. Predetermined voltage $V_{P1}$ is chosen by conventional means by selecting size ratios of transistors 24 and 22, and taking into account the threshold voltage of transistors 24 and 16. Each transistor has a size ratio defined by a channel width to channel length ratio. The larger the size ratio of transistor 24 is relative to the size ratio of transistor 22, the smaller the predetermined voltage $V_{P1}$ is.

A memory cell in a conducting state does not have sufficient current conducting capability for the current supplied when transistors 16, 18 and 34 are conducting. Consequently, even when the memory cell is in a conducting state node 26 will increase in voltage until predetermined voltage $V_{P1}$ is reached which causes transistor 16 to turn off. The memory cell in a conducting state will, however, have sufficient current carrying capability for the current supplied by transistors 18 and 34. With transistor 34 turned on, the voltage on node 26 which is essentially predetermined voltage $V_{P1}$ is coupled to the output of sense amplifier 10 for detection as logic "0". Because transistor 34 is conducting some current, the output of sense amplifier 10 will be a slightly higher voltage than the voltage on node 26.

Transistors 30, 28 and 18 operate in the same manner as transistors 24, 22 and 16 respectively with the exception that transistor 18 will not turn off until the voltage on node 26 reaches a predetermined voltage $V_{P2}$ which is a higher voltage than predetermined voltage $V_{P1}$. This is achieved by having the ratio of the size ratio of transistor 30 to the size ratio of transistor 28 be smaller than the ratio of the size ratio of transistor 24 to the size ratio of transistor 22. One way of achieving this is to have the size ratios of transistors 22 and 28 be equal and to reduce the size ratio of transistor 30 below that of transistor 24. Accordingly, transistor 18 will continue to be on until the voltage on node 26 rises past the predetermined voltage $V_{P1}$ and reaches predetermined voltage $V_{P2}$. Because the gate and source of transistor 34 are connected to the gate and source of transistor 18, respectively, and because transistors 34 and 18 have the same characteristic threshold voltage, if transistor 18 is on, transistor 34 is on.

When a column having a memory cell in a non-conducting state is coupled to node 26, transistors 16, 18 and 34 will all be on, charging the capacitance associated with the column. When the voltage on node 26 reaches predetermined voltage $V_{P1}$, transistor 16 will turn off. Transistors 18 and 34 will continue to charge the column capacitance until the voltage on node 26 reaches predetermined voltage $V_{P2}$ at which time transistors 18 and 34 turn off. With transistor 34 off, the output of sense amplifier 10 will be essentially $V_{DD}$ and detected as a logic "1". As previously described, the difference between the two predetermined voltages $V_{P1}$ and $V_{P2}$ is developed by providing size ratio differentials between inverters 12 and 14. The size ratio differentials must be large enough to ensure a sufficient difference between the predetermined voltages $V_{P1}$ and $V_{P2}$ for reliable detection over process variations but at the same time must be minimized in order to minimize delay time for detection.

Shown in FIG. 2 is a sense amplifier 36 according to a preferred embodiment of the present invention comprised generally of an inverter 38, an enhancement transistor 40, a natural transistor 42, and an output circuit 44. Inverter 38 comprises a depletion transistor 45 and a natural transistor 46. Transistor 45 has a drain connected to $V_{DD}$, and a source and a gate connected together at an output of inverter 38. Transistor 46 has a gate connected to a node 50 which is an input of inverter 38 and an input of sense amplifier 36, a source connected to ground, and a drain connected to the source and gate of transistor 45. Transistor 40 has a gate connected to the output of inverter 38, a drain connected to $V_{DD}$, and a source connected to node 50. Transistor 42 has a gate connected to the output of inverter 38, a drain connected to $V_{DD}$, and a source connected to node 50. Output circuit 44 comprises a depletion transistor 52 and a natural transistor 54. Transistor 52 has a drain connected to $V_{DD}$, and a source and a gate connected together. Transistor 54 has a gate connected to the output of inverter 38, a drain connected to the source and gate of transistor 52 at an output of sense amplifier 36, and a source connected to node 50.

A column of memory cells is coupled to sense amplifier 36 in the same way as that described for sense amplifier 10. A column of memory cells containing a selected memory cell is coupled to node 50 via a column decoder. In the same manner as inverter 12 and transistor 16 of sense amplifier 10 cooperate to charge a column to predetermined voltage $V_{P1}$, inverter 38 and transistor 40 cooperate to charge a column coupled to node 50 to a predetermined voltage $V_{PV1}$. Transistors 42 and 54 continue to charge the column to a second predetermined voltage $V_{PV2}$ in the case where the selected memory cell in the column is in a non-conducting state.

Although the result of charging the column coupled to node 50 to predetermined voltage $V_{PV2}$ is analogous to inverter 14 and transistor 18 of sense amplifier 10 cooperating to charge a column coupled to node 26 to predetermined voltage $V_{P2}$, the manner of achieving the result is substantially different. With node 50 initially at ground, transistors 40, 42 and 54 are conducting. As the voltage on node 50 increases, the output voltage of inverter 38 decreases until eventually a voltage difference $V_{GS40}$ between the output of inverter 38 and node 50 is less than the threshold voltage of transistor 40. This is the condition for which node 50 is at predetermined voltage $V_{PV1}$ and for which transistor 40 turns off. With the voltage difference $V_{GS40}$ at only slightly below the threshold voltage of transistor 40, transistors 42 and 54 will remain on because they are natural transistors with a lower threshold voltage than enhancement transistor 40.

If the selected memory cell is in a conducting state, node 50 will remain at essentially predetermined voltage $V_{PV1}$ because the memory cell has enough current carrying capability for the current supplied by transistors 42 and 54. With transistor 54 still on, the voltage on node 50 which is essentially predetermined voltage $V_{PV1}$ is coupled to the output of sense amplifier 36 for detection as a logic "0". Because transistor 54 is conducting some current, the output of sense amplifier 36 will be a slightly higher voltage than the voltage on node 50. If the selected memory cell is in a non-conducting state, then transistors 42 and 54 will continue to charge the column capacitance, increasing the voltage on node 50. As the voltage on node 50 increases, the output voltage of inverter 38 decreases, decreasing the gate to source voltage $V_{GS40}$ of transistors 42 and 54. When predetermined voltage $V_{PV2}$ is reached on node 50, voltage difference $V_{GS40}$ drops below the threshold voltage of transistors 42 and 54, turning transistors 42 and 54 off. With transistor 54 off, the output of sense amplifier 36 is at essentially $V_{DD}$ which is detected as a logic "1".

The difference between predetermined voltage $V_{PV1}$ and $V_{PV2}$ is accomplished using the threshold voltage differential between two transistor types, in this case natural and enhancement transistors. The threshold voltage differential is very nearly constant in a conventional process even though the absolute values of the threshold voltages are not constant. In a conventional N channel process, channels of all transistors begin with a common doping level. Channels of enhancement transistors are subsequently doped with P type material, channels of depletion transistors are subsequently doped with N type material, but channels of natural transistors are not subsequently doped from the common doping level. Accordingly, the threshold voltage of enhancement transistors are controllably larger than the threshold voltage of the natural transistors. Consequently, that predetermined voltage $V_{PV2}$ is larger than predetermined voltage $V_{PV1}$ is ensured by transistor 40 being an enhancement transistor and transistor 42 being a natural transistor. Additionally, the difference between predetermined voltages $V_{PV1}$ and $V_{PV2}$ is very small because of gain associated with inverter 38. A relatively small increase beyond predetermined voltage $V_{PV1}$ will reduce the output of inverter 38 sufficiently to reduce voltage difference $V_{GS40}$ to turn off transistors 40 and 42. Because the difference between predetermined voltages $V_{PV1}$ and $V_{PV2}$ is very small, the time required to charge the column capacitance between predetermined voltages $V_{PV1}$ and $V_{PV2}$ is also small.

Shown in FIG. 3 is a sense amplifier 36' in a modified form of sense amplifier 36 of FIG. 2 having additional natural transistors 56 and 58 and a depletion transistor 60. Transistor 60 has a gate and drain connected to node 50, and a source connected to ground. Transistor 58 is interposed between the source of transistor 46 and ground. Transistor 58 has a gate and drain connected to the source of transistor 46, and a source connected to ground. Transistor 56 has a drain connected to $V_{DD}$, a source connected to the gate and drain of transistor 58, and a gate connected to the drain of transistor 46.

Transistor 60 has a very small size ratio and is for the purpose of providing a very small amount of leakage current from node 50. This is to ensure node 50 does not remain charged beyond predetermined voltage $V_{PV2}$. A selected memory cell in a conducting logic state may be the only means for discharging a column which has been charged. Consequently if a column has been charged beyond predetermined voltage $V_{PV2}$, the column would have to be discharged by the selected memory below predetermined voltage $V_{PV2}$ before a logic "0" could be detected. Because of the column capacitance, such a discharge could be too time consuming. Transistor 60 provides a current path from node 50 to ground to prevent a column from remaining at a voltage above predetermined voltage $V_{PV2}$. The current path is of high resistance so as not to interfere with the normal function of transistors 40, 42 and 54.

Transistor 58 effectively raises the voltage on node 50 at which transistor 46 turns on. The source of transistor 46 is raised to a higher voltage by transistor 58 so that a higher voltage on node 50 is required before the threshold voltage of transistor 46 is reached. When transistor 46 is off, the gate of transistor 56 is at essentially $V_{DD}$, causing transistor 56 to supply current to transistor 58. Size ratios of transistors are chosen by conventional means so that the current supplied by transistor 56 raises the voltage on the gate and drain of transistor 58 several tenths of a volt above the threshold voltage of transistor 58. When transistor 46 turns on, transistor 46 begins providing current to transistor 58 which tends to drive the voltage on the source of transistor 46 higher. This effect is undesirable because it would reduce the gate to source voltage on transistor 46 and thereby effectively reduce responsiveness to the voltage on node 50. To counteract this effect, the current supplied by transistor 56 to transistor 58 is reduced. As a result of transistor 46 turning on, the voltage on the gate of transistor 56 is reduced, causing transistor 56 to provide less current to transistor 58.

Use of transistors 56 and 58 in the described fashion allows for increasing the size ratio of transistor 46 while keeping predetermined voltages $V_{PV1}$ and $V_{PV2}$ essentially the same. Transistor 46 thus has a higher gain which results in it being more responsive to the voltage one node 50.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

We claim:

1. A sense amplifier comprising:
    inverter means for providing a bias signal which is inversely proportional to a signal present at a charge node;
    a first transistor having a control electrode coupled to the bias signal, a first current electrode coupled to a power supply terminal, and a second current electrode coupled to the charge node;
    a second transistor having a control electrode coupled to the bias signal, a first current electrode coupled to the power supply terminal, and a second current electrode coupled to the charge node;
    a third transistor having a control electrode coupled to the bias signal, a first current electrode coupled to the charge node, and a second current electrode coupled to an output terminal and;
    load means coupled between the power supply terminal and the output terminal for dropping voltage in proportion to current passing therethrough.

2. The sense amplifier of claim 1 wherein the first transistor has a first characteristic theshold voltage and the second and third transistors each have a second characteristic threshold voltage, said first threshold voltage being larger than the second threshold voltage.

3. A circuit comprising:
    inverter means for providing a bias signal which is inversely proportional to a signal present at a charge node;
    a first transistor having a control electrode coupled to the bias signal, a first current electrode coupled to a first power supply terminal, and a second current electrode coupled to the charge node, and having a characteristic threshold voltage; a second transistor having a control electrode coupled to the bias signal, a first current electrode coupled to the first power supply terminal, and a second current electrode coupled to the charge node, and having a characteristic threshold voltage which is different than the characteristic threshold voltage of the first transistor; and
    an output circuit having an input coupled to the charge node, and an output for providing an output signal.

4. The circuit of claim 3 wherein the inverter means comprises:
    load means coupled to the first power supply terminal for dropping voltage in proportion to current passing therethrough; and
    a gain transistor having a first current electrode for providing the bias signal coupled to the load means and drawing current therethrough, a control electrode coupled to the charge node, and a second current electrode coupled to a second power supply terminal.

5. The circuit of claim 4, further comprising a resistive means, interposed between the second current electrode of the gain transistor and the second power supply terminal, for providing a voltage drop proportional to current passing therethrough.

6. The circuit of claim 5 further comprising a current means for providing current proportional to the bias signal to the resistive means.

7. The circuit of claim 3 wherein the first transistor is an enhancement-mode field effect transistor and the second transistor is an enhancement-mode field effect transistor having a threshold voltage of 0.0 to 0.4 volt.

8. The circuit of claim 7 wherein said output circuit comprises a third transistor having a control electrode coupled to the bias signal, a first current electrode coupled to the charge node, and a second current electrode coupled to an output terminal, wherein said third transistor is a enhancement-mode filed effect transistors having a threshold voltage of 0.0 to 0.4 volt.

9. The circuit of claim 8 wherein the inverter means comprises:
    a fourth transistor having a first current electrode coupled to the first power supply terminal, and a control electrode and a second current electrode coupled together, wherein said fourth transistor is a depletion-mode field effect transistor; and
    a fifth transistor having a first current electrode for providing the bias signal coupled to the control electrode and the second current electrode of the fourth transistor, a control electrode coupled to the charge node, and a second current electrode coupled to a second power supply.

10. The circuit of claim 9 further comprising a sixth transistor interposed between the second current electrode of the fifth transistor and the second power supply terminal, said sixth transistor having a control electrode and a first current electrode coupled to the second current electrode of the fifth transistor, and a second current electrode coupled to the negative power supply terminal.

11. The circuit of claim 10 wherein the fifth and sixth transistors are enhancement-mode field effect transistors having a threshold voltage of 0.0 to 0.4 volt.

12. The circuit of claim 11 further comprising a seventh transistor having a control electrode coupled to the bias signal, a first current electrode coupled to the first power supply terminal, and a second current electrode coupled to the control electrode and the first current electrode of the sixth transistor, wherein said seventh transistor is an enhancement-mode field effect transistor having a threshold voltage of 0.0 to 0.4 volt.

13. The circuit of claim 12 further comprising an eighth transistor having a control electrode and a first current electrode coupled to the charge node, and a second current electrode coupled to the second power supply terminal.

14. The circuit of claim 13 further comprising a ninth transistor having a first current electrode coupled to the first power supply terminal, and a control electrode and a second current electrode coupled to the output terminal.

15. The circuit of claim 14 wherein the eighth and ninth transistors are depletion-mode field effect transistors.

* * * * *